United States Patent
Sautto et al.

(10) Patent No.: US 11,336,202 B1
(45) Date of Patent: May 17, 2022

(54) OVER VOLTAGE PROTECTION FOR WIRELESS POWER RECEIVER CIRCUITS

(71) Applicant: Renesas Electronics America Inc., Milpitas, CA (US)

(72) Inventors: Marco Sautto, Zurich (CH); Sercan Ipek, Zurich (CH); Jiangjian Huang, San Jose, CA (US); Turev Acar, San Diego, CA (US)

(73) Assignee: Renesas Electronics America Inc., Milpitas, CA (US)

( * ) Notice: Subject to any disclaimer, the term of this patent is extended or adjusted under 35 U.S.C. 154(b) by 0 days.

(21) Appl. No.: 17/318,515

(22) Filed: May 12, 2021

(51) Int. Cl.
| | |
|---|---|
| *H02M 7/217* | (2006.01) |
| *H02J 50/10* | (2016.01) |
| *H02M 1/08* | (2006.01) |
| *H03F 3/45* | (2006.01) |

(52) U.S. Cl.
CPC ............ *H02M 7/217* (2013.01); *H02J 50/10* (2016.02); *H02M 1/08* (2013.01); *H03F 3/45475* (2013.01)

(58) Field of Classification Search
CPC ..... H02M 7/217; H02M 1/08; H03F 3/45475; H02J 50/10; H02J 50/005; H02J 7/025
USPC ........................................................ 307/104
See application file for complete search history.

(56) References Cited

U.S. PATENT DOCUMENTS

| | | | |
|---|---|---|---|
| 9,755,423 B2 * | 9/2017 | Sandner | H02H 7/1252 |
| 2020/0076235 A1 * | 3/2020 | Smith | H02J 50/80 |

* cited by examiner

*Primary Examiner* — Metasebia T Retebo
(74) *Attorney, Agent, or Firm* — Scully, Scott, Murphy & Presser, P.C.

(57) ABSTRACT

Methods and apparatuses for controlling a rectified voltage outputted by a rectifier circuit is described. In response to an occurrence of an overvoltage condition, an apparatus can regulate a gate-source voltage of a low-side switching element of the rectifier circuit to control the rectified voltage. The apparatus can include an operational amplifier that can compare a reference voltage and with a scaled voltage measured at a node between the low-side switching element and a high-side switching element of the rectifier circuit. The operational amplifier can output a voltage to regulate a gate-source voltage of a low-side switching element. The apparatus can further include a current sensor configured to sense current flowing through the low-side switching element. A power dissipation of the low-side switching element can be controlled based on the current being sensed by the current sensor.

13 Claims, 6 Drawing Sheets

200

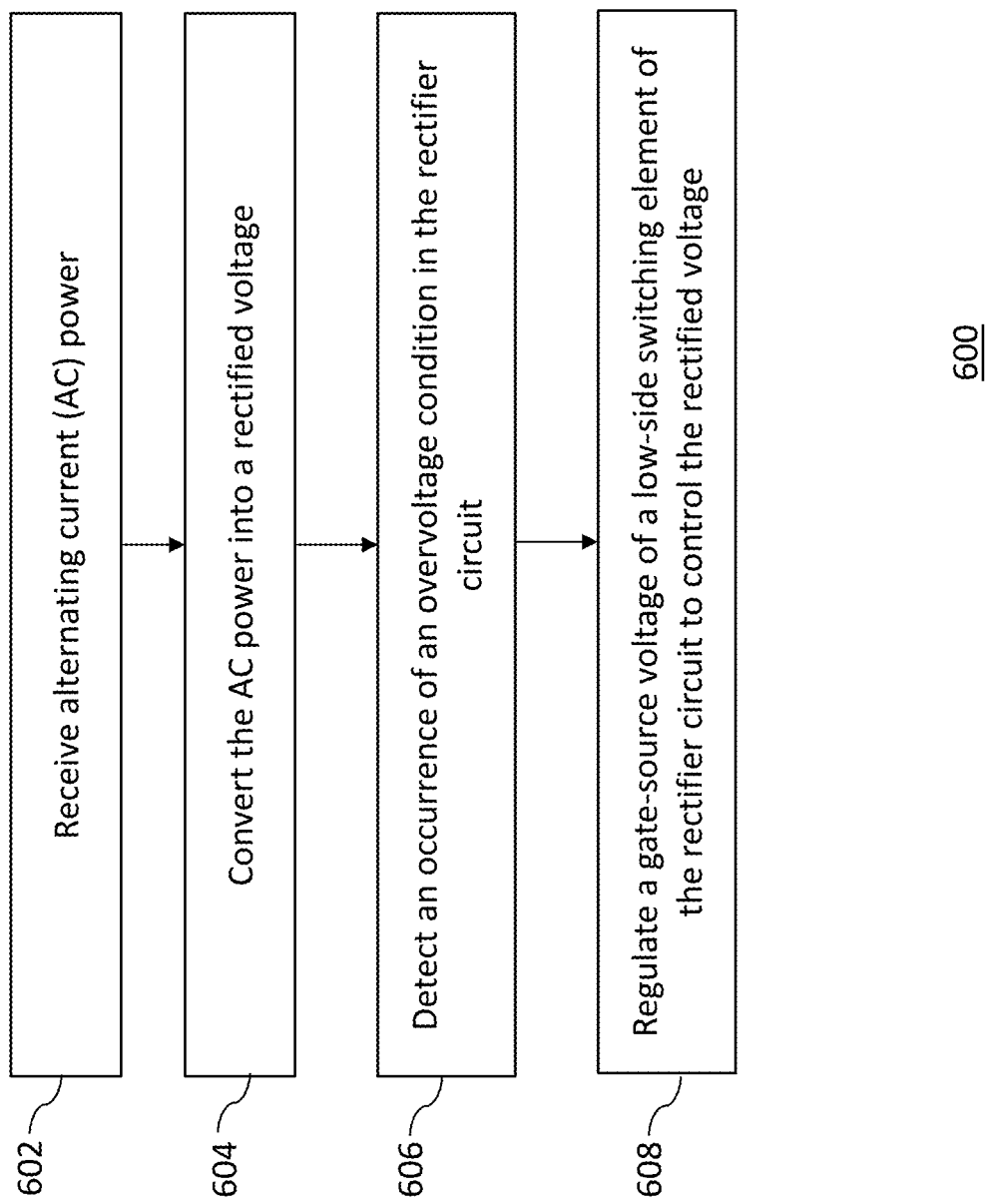

US 11,336,202 B1

OVER VOLTAGE PROTECTION FOR WIRELESS POWER RECEIVER CIRCUITS

BACKGROUND

The present disclosure relates in general to apparatuses and methods for over voltage protection for wireless power receiver circuits.

A wireless power system can include a transmitter having a transmission coil and a receiver having a receiver coil. The transmission coil and the receiver coil can be brought close to one another to form a transformer that can facilitate inductive transmission of alternating current (AC) power. The receiver can include a rectifier circuit that can convert the AC power into direct current (DC) power for various loads or components that require DC power to operate.

SUMMARY

In some examples, an apparatus for controlling a rectified voltage outputted by a rectifier circuit is generally described. The apparatus can include the rectifier circuit configured to output the rectified voltage. The apparatus can further include a controller connected to the rectifier circuit. The controller can be configured to regulate a gate-source voltage of a low-side switching element of the rectifier circuit to control the rectified voltage.

In some examples, an apparatus for controlling a rectified voltage outputted by a rectifier circuit is generally described. The apparatus can include a receiver configured to receive alternating current (AC) power. The apparatus can further include the rectifier circuit configured to convert the AC power into the rectified voltage. The apparatus can further include a controller connected to the rectifier circuit. The controller can be configured to regulate a gate-source voltage of a low-side switching element of the rectifier circuit to control the rectified voltage.

In some examples, a method for controlling a rectified voltage outputted by a rectifier circuit is generally described. The method can include regulating a gate-source voltage of a low-side switching element of the rectifier circuit to control the rectified voltage being outputted by the rectifier circuit.

Further features as well as the structure and operation of various embodiments are described in detail below with reference to the accompanying drawings. In the drawings, like reference numbers indicate identical or functionally similar elements.

BRIEF DESCRIPTION OF THE DRAWINGS

FIG. 6 is a flow diagram illustrating a process of implementing over voltage protection for wireless power receiver circuits in one embodiment.

DETAILED DESCRIPTION

In an example, during wireless power transmission from the transmitter to the receiver, movement of the transmitter and/or the receiver can change a coupling coefficient of the transformer formed by the transmission and receiver coils. The changes in the coupling coefficient can affect the rectified voltage of the DC power being outputted to a load by the rectifier circuit. If the outputted rectified voltage exceeds the voltage require by the load, an overvoltage condition can occur and can damage the receiver.

To address overvoltage conditions, some systems can utilize voltage clamping mechanisms that can include additional circuit components on the receiver or external components to be coupled to the receiver. For example, in some systems, an interface or a pin can be added to the receiver, and a voltage clamp (or switching element) can be added internally in the receiver, or coupled to the receiver externally. The voltage clamp can be connected to the added pin to facilitate discharge of the rectified voltage in response to an overvoltage condition. However, these additional pins and voltage clamps can occupy circuit board space and/or internal silicon area in the receiver and can be expensive.

Figure 1:
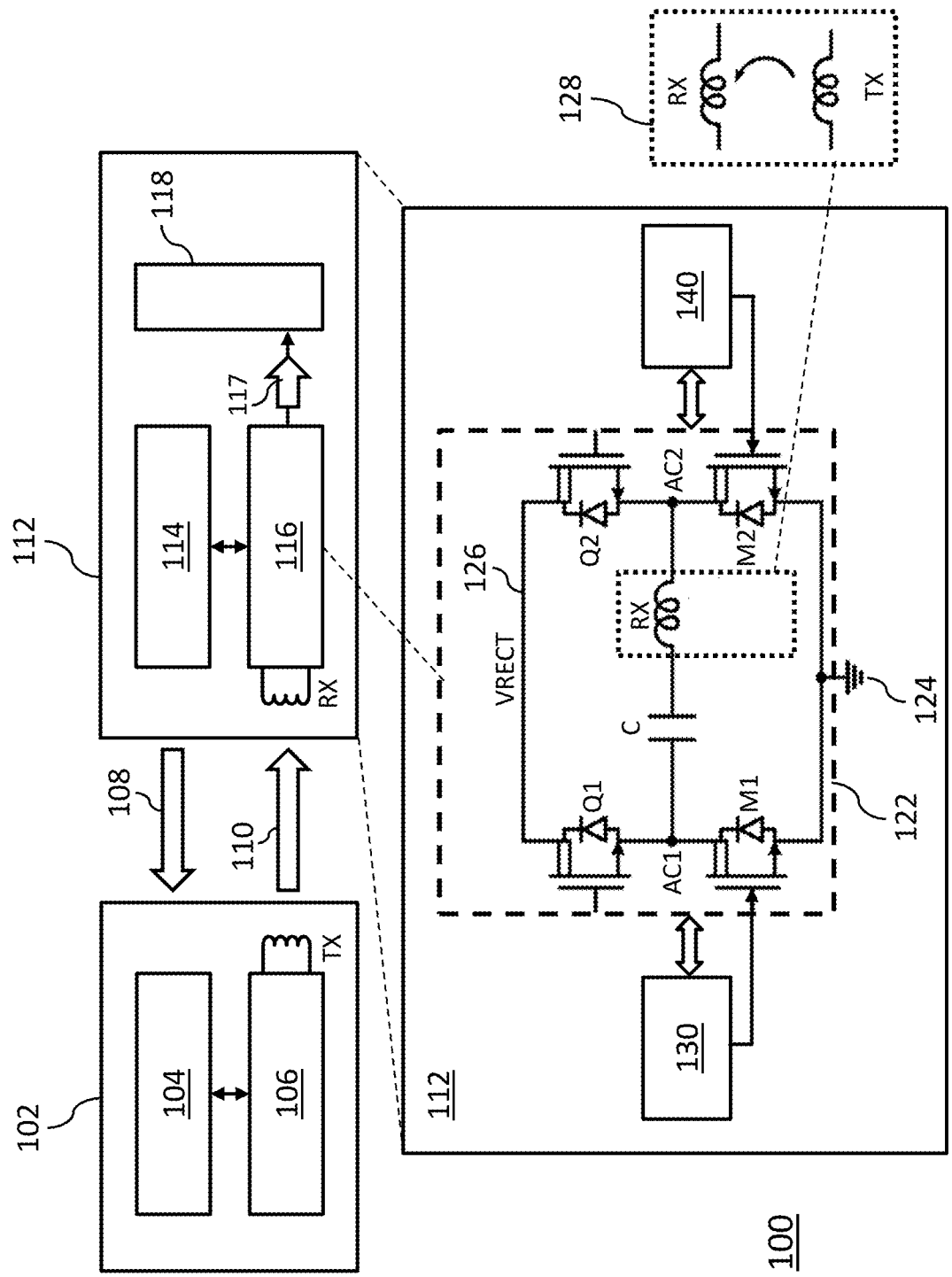
FIG. 1 is a diagram showing an example system that can implement over voltage protection for wireless power receiver circuits in one embodiment.

FIG. 1 is a diagram showing an example system 100 that can implement over voltage protection for wireless power receiver circuits in one embodiment. The system 100 can be a wireless communication system that can facilitate wireless transmission of power and/or data. The system 100 can include a transmitter 102 and a receiver 112 configured to be in communication with each other. The transmitter 102 can be a wireless power transmitter connected to a DC power supply and can transmit AC power from the connected DC power supply. The transmitter 102 can include a controller 104 and a power driver 106. The power driver 106 can include a coil, labeled as TX. The controller 104 can be configured to control and operate the power driver 106. In an example, the controller 104 can be configured to control the power driver 106 to drive the Coil TX to produce a magnetic field. The power driver 106 can drive the Coil TX at a range of frequencies and configurations defined by wireless power standards, such as the Wireless Power Consortium (Qi) standard, the Power Matters Alliance (PMA) standard, and/or the Alliance for Wireless Power (A for WP, or Rezence) standard.

The receiver 112 can be a wireless power receiver that can be located in, for example, a computing device, a mobile phone, a tablet device, a wearable device, and/or other electronic devices that can be configured to receive power wirelessly. The receiver 112 can include a controller 114 and a power rectifier 116. The power rectifier 116 can include a coil, labeled as RX. The magnetic field produced by the Coil TX of the power driver 106 can induce a current in the Coil RX of the power rectifier 116. The induced current can cause an amount of AC power 110 to be inductively transmitted from the power driver 106 to the power rectifier 116. The power rectifier 116 can receive the AC power 110 and convert the AC power 110 into direct current (DC) power 117, and provide the DC power 117 to load 118. The load 118 can be, for example, a battery charger configured to charge a battery, a DC-DC converter configured to supply a processor or a display, and/or other electronic components that requires the DC power 117 to operate.

The power rectifier 116 can include a rectifier circuit 122. The rectifier circuit 122 can include the Coil RX and a capacitor C connected in series with a voltage node AC1 and a voltage node AC2. The rectifier circuit 122 can include a full rectifier bridge formed by a high-side switching element Q1, a high-side switching element Q2, a low-side switching element M1, and a low-side switching element M2. The switching elements Q1, Q2, M1, M2 can be transistors such as metal-oxide-semiconductor field-effect transistors (MOSFETs). The high-side switching element Q1 can be connected between a voltage line 126 and the voltage node AC1. The high-side switching element Q2 can be connected between the voltage line 126 and the voltage node AC2. The low-side switching element M1 can be connected between the voltage node AC1 and a ground terminal 124. The low-side switching element M2 can be connected between the voltage node AC2 and the ground terminal 124.

The voltage line 126 can be connected to the load 118. The rectifier circuit 122 can produce a rectified voltage VRECT, and VRECT can be outputted on the voltage line 126 as the DC power 117. To perform the rectification that converts the AC power 110 into the DC power 117, the controller 114 can, alternatively, switch or activate the switching elements M1 and Q2 simultaneously, then switch or activate the switching elements M2 and Q1 simultaneously, to convert the AC power 110 into DC power 117. In response to the activation of the switching elements M1 and Q2 simultaneously, current can flow in a direction from the node AC1 to AC2, and towards the voltage line 126 via the high-side switching element Q2. In response to the activation of the switching elements M2 and Q1 simultaneously, current can flow in another direction from the node AC2 to AC1, and towards the voltage line 126 via the high-side switching element Q1.

The AC power 110 can be received at the Coil RX from the Coil TX of the power driver 106 of the transmitter 102. For example, the transmitter 102 and the receiver 112 can be located in proximity to one another, such that the TX and Coil RXs can be close enough to create a transformer 128 that can facilitate the inductive transmission of AC power 110. The transformer 128 can have a coupling coefficient that can have a wide range of variation depending on a distance and the alignment of the TX and Coil RXs. The amount of AC power 110 being transmitted can vary with the coupling coefficient, and the coupling coefficient can decrease as a distance between the Coil TX and the Coil RX increases.

In some example, an overvoltage condition in the receiver 112 can occur when the AC power 110 received at the Coil RX is more than the rectified voltage VRECT required by the load 118. For example, if the transmitter 102 is a wireless charging device and the receiver 112 is located in a mobile phone, as the mobile phone moves on the wireless charging device, the coupling coefficient can vary abruptly. If the coupling coefficient is increased, the AC power 110 being transferred can increase. If the AC power 110 is increased to a level that is more than required by the load 118, an overvoltage condition in the receiver 112 can occur. In another example, the amount of current being drawn by the load 118 can decrease, which can also decrease the rectified voltage VRECT being applied to the load 118. If VRECT is decreased to a level that is less than the received AC power 110, an overvoltage condition in the receiver 112 can occur. In some examples, these overvoltage conditions can cause damages to the receiver 112.

In order to prevent VRECT from increasing past a certain voltage level (e.g., a required voltage by the load 118), a certain amount of power can be dissipated elsewhere, such as to the low-side switching elements M1 and M2. The receiver 112 can include a circuit 130 and a circuit 140 connected to the rectifier circuit 122, where the circuit 130 and the circuit 140 can include identical components. In some examples, the circuits 130 and 140 can be a part of the controller 114. The circuit 130 can be configured to control the switching element M1 based on voltage and/or current measured at various points between the voltage line 126, the node AC1, and the switching element M1. The circuit 140 can be configured to control the switching element M2 based on voltage and/or current measured at various points between the voltage line 126, the node AC2, and the switching element M2. In an example, the circuits 130 and 140 can be configured to linearly control the switching elements M1 and M2, respectively, in order to regulate VRECT to a desired level.

Figure 2:
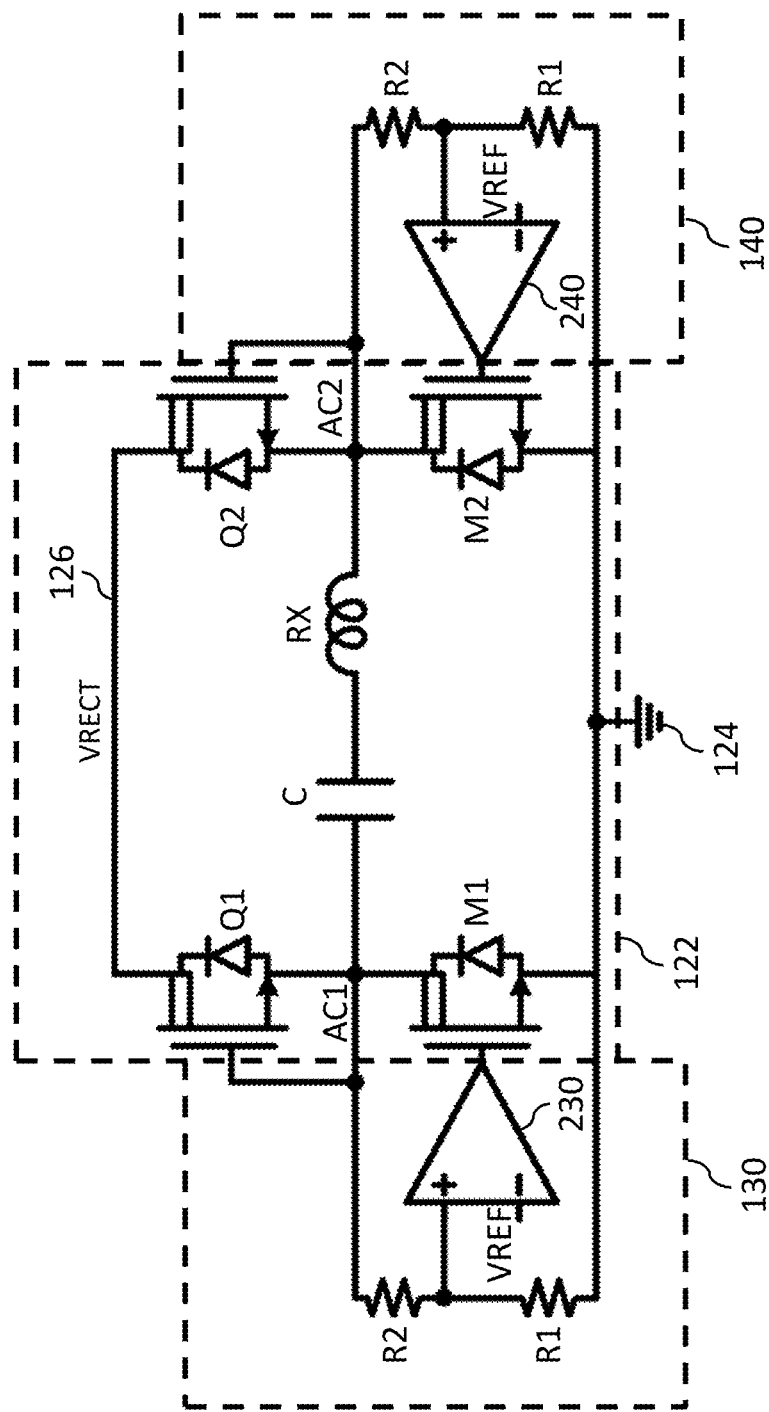
FIG. 2 is a diagram showing an example apparatus that can implement over voltage protection for wireless power receiver circuits in one embodiment.

FIG. 2 is a diagram showing an example apparatus 200 that can implement over voltage protection for wireless power receiver circuits in one embodiment. The apparatus 200 shown in FIG. 2 can be inside the receiver 112 shown in FIG. 1. The apparatus 200 can include the rectifier circuit 122, the circuit 130, and the circuit 140. The circuit 130 can include an amplifier 230, where an output terminal of the amplifier 230 can be connected to a gate terminal of the switching element M1. The circuit 140 can include an amplifier 240, where an output terminal of the amplifier 240 can be connected to a gate terminal of the switching element M2. The amplifiers 230 and 240 can be, for example, operational amplifiers (e.g., operational transconductance amplifiers (OTAs)) that can operate as a voltage controlled current source configured to receive differential input voltage and produce output current.

The inverting input terminal of the amplifier 230 can be connected to a reference voltage source configured to provide a reference voltage VREF. The non-inverting input terminal of the amplifier 230 can be connected to the node AC1 to detect a voltage at the node AC1. A resistor having a resistance value of R2 can be connected between the non-inverting input terminal of the amplifier 230 and the node AC1. Another resistor having a resistor value of R1 can be connected between the non-inverting input terminal of the amplifier 230 and the ground terminal 124. Further, the gate terminal of the high-side switching element Q1 can be connected to a source terminal of the high-side switching element Q1, via the node AC1, in order to turn off the high-side switching element Q1. In an example, the switching element Q1 can include a switching gate driver to turn Q1 on and off during the normal operation (e.g., turning Q1 on and off with M2). In response to an occurrence of an overvoltage, the gate driver can drive Q1 to an off state.

The inverting input terminal of the amplifier 240 can be connected to a reference voltage source configured to provide the reference voltage VREF. The non-inverting input terminal of the amplifier 240 can be connected to the node AC2 to detect a voltage at the node AC2. A resistor having the resistance value of R2 can be connected between the non-inverting input terminal of the amplifier 240 and the node AC2. Another resistor having the resistor value of R1 can be connected between the non-inverting input terminal of the amplifier 240 and the ground terminal 124. Further, the gate terminal of the high-side switching element Q2 can be connected to a source terminal of the high-side switching element Q2, via the node AC2, in order to turn off the high-side switching element Q2. In an example, the high-side switching elements Q1 and Q2 can be turned off to avoid shoot-through current from the voltage line 126 to the ground terminal 124. In an example, the switching element Q2 can include a switching gate driver to turn Q2 on and off during the normal operation (e.g., turning Q2 on and off with M1). In response to an occurrence of an overvoltage, the gate driver can drive Q2 to an off state.

The connection between the node AC1 and the amplifier 230 can create a voltage feedback loop that can allow the amplifier 230 to operate based on the voltage on the node AC1. The connection between the node AC2 and the amplifier 240 can create a voltage feedback loop that can allow the amplifier 240 to operate based on the voltage on the node AC2. A comparison between the reference voltage VREF and a scaled down version of the voltage at the node AC1 (e.g., scaled by a factor of R1/(R1+R2)), and/or a comparison between the reference voltage VREF and a scaled down version of the voltage at the node AC2 (e.g., scaled by the factor of R1/(R1+R2)), can indicate whether an overvoltage condition is occurring in the receiver 112 or not.

The amplifier 230 can receive the reference voltage VREF and the voltage at the node AC1 as differential voltage input. An overvoltage event or condition can be detected in response to the voltage at the node AC1 being greater than the reference voltage VREF. In response to the overvoltage event, the amplifier 230 can output a voltage (e.g., a gate-source voltage VGS of M1) to activate the low-side switching element M1. The activation of the low-side switching element M1 can cause the current flowing into the node AC1 to split into two current paths—one current path going towards the voltage line 126 via the high-side switching element Q1, and the other current path going towards the ground terminal 124 via the activated low-side switching element M1.

The amplifier 240 can receive the reference voltage VREF and the voltage at the node AC2 as differential voltage input. An overvoltage event or condition can be detected in response to the voltage at the node AC2 being greater than the reference voltage VREF. In response to the overvoltage event, the amplifier 240 can output a voltage (e.g., a gate-source voltage VGS of M2) to activate the low-side switching element M2. The activation of the low-side switching element M2 can cause the current flowing into the node AC2 to split into two current paths—one current path going towards the voltage line 126 via the high-side switching element Q2, and the other current path going towards the ground terminal 124 via the activated low-side switching element M2.

By activating the low-side switching elements M1 and/or M2 in response to a detection of overvoltage condition, the circuit 130 and 140 can provide overvoltage protection by redirecting a portion of current at the voltage nodes AC1 and AC2 toward the ground terminal 124. By redirecting the current at the voltage nodes AC1 and AC2 to the ground terminal 124, the voltages on the nodes AC1 and AC2, and the rectified voltage VRECT, can be controlled or adjusted. For example, the rectified voltage VRECT can be limited or clamped to a desired level to prevent overvoltage conditions. In an example, the redirecting of the current at the voltage nodes AC1 and AC2 to the ground terminal 124, and the values of the resistance R1, R2, and VREF, can define a maximum value of the rectified voltage VRECT. The defined maximum value of VRECT can allow the circuits 130 and 140 to clamp VRECT at a desired level in order to prevent overvoltage conditions. For example, the maximum value of VRECT can be defined as:

$$VRECT_{MAX} = VREF \cdot \left(1 + \frac{R2}{R1}\right) - V_{diode}$$

where $VRECT_{MAX}$ denotes the maximum value of VRECT and $V_{diode}$ defines the forward voltage of the body diode of the high-side switching element where current is flowing through.

Figure 3:
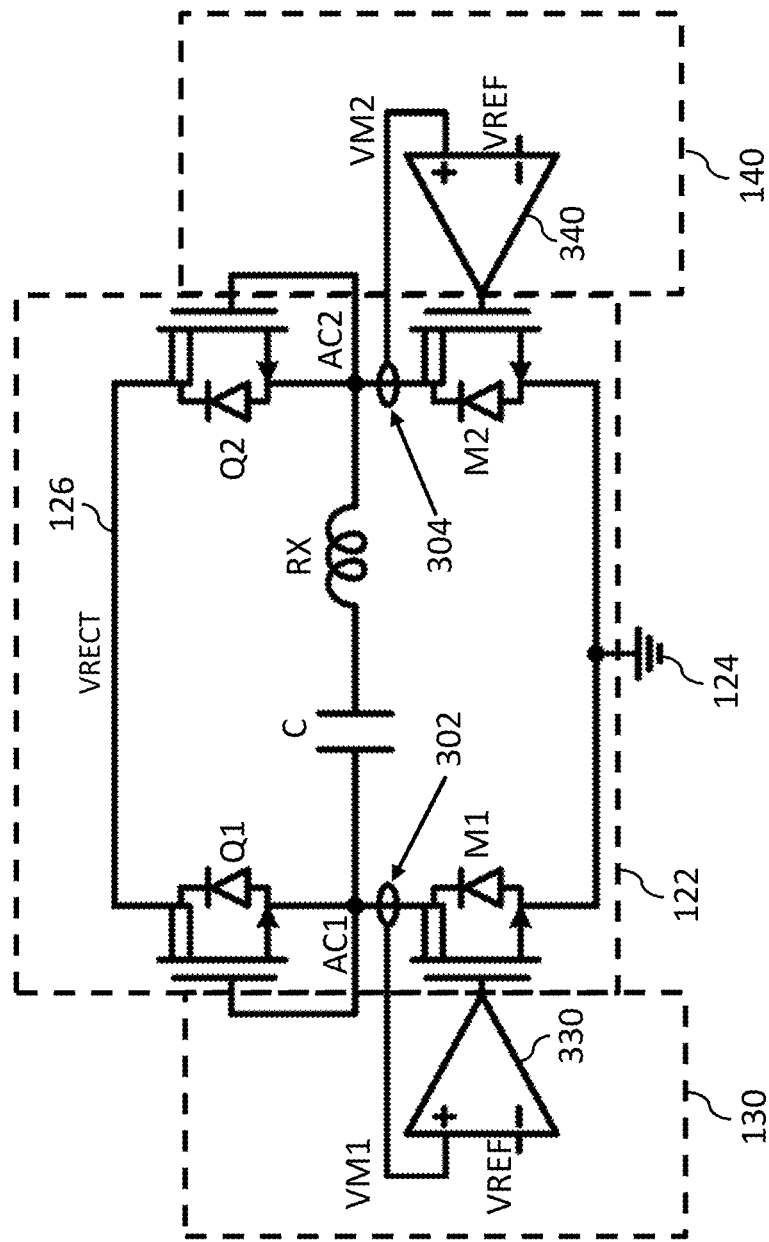
FIG. 3 is a diagram showing another example apparatus that can implement over voltage protection for wireless power receiver circuits in one embodiment.

FIG. 3 is a diagram showing another example apparatus 300 that can implement over voltage protection for wireless power receiver circuits in one embodiment. The apparatus 300 shown in FIG. 3 can be inside the receiver 112 shown in FIG. 1. The apparatus 300 can include the rectifier circuit 122, the circuit 130, the circuit 140, a current sensor 302, and a current sensor 304. The circuit 130 can include an amplifier 330, where an output terminal of the amplifier 330 can be connected to a gate terminal of the switching element M1. The circuit 140 can include an amplifier 340, where an output terminal of the amplifier 340 can be connected to a gate terminal of the switching element M2. The amplifiers 330 and 340 can be, for example, operational amplifiers (e.g., operational transconductance amplifiers (OTAs)) that can operate as a voltage controlled current source configured to receive differential input voltage and produce output current.

The current sensor 302 can be connected between the voltage node AC1 and a drain terminal of the low-side switching element M1. The current sensor 302 can be configured to sense the current flowing inside M1 and convert this sensed current into a voltage VM1. The current sensor 304 can be connected between the voltage node AC2 and a drain terminal of the low-side switching element M2. The current sensor 304 can be configured to sense the current flowing inside M2 and convert this sensed current into a voltage VM2. In an example embodiment, the current sensors 302 and 304 can each be implemented as a series resistor and an amplifier. It will be apparent to a person of ordinary skill in the art that other implementations of the current sensors 302 and 304 are probable, depending on a desired implementation of the system 100.

The inverting input terminal of the amplifier 330 can be connected to a reference voltage source configured to provide a reference voltage VREF. The non-inverting input terminal of the amplifier 330 can be connected to an output of current sensor 302 in order for the voltage VM1 to be provided to the non-inverting input terminal of the amplifier 330. The connection between the current sensor 302 and the amplifier 330 can create a current feedback loop that can control the current flowing through the low-side switching element M1. By controlling the current flowing through the low-side switching element M1, an amount of power dissipated by low-side switching element M1 can be controlled. In an example, the amount of power dissipated by low-side switching element M1 can be limited by the current control loop formed between the current sensor 302 and the amplifier 330 in order to prevent excessive power dissipation or excessive heating in the receiver 112. Further, the gate terminal of the high-side switching element Q1 can be connected to the source terminal of the high-side switching element Q1, via the node AC1, in order to turn off the high-side switching element Q1.

The inverting input terminal of the amplifier 340 can be connected to the reference voltage source configured to provide a reference voltage VREF. The non-inverting input terminal of the amplifier 340 can be connected to an output of a current sensor 304 in order for the voltage VM1 to be provided to the non-inverting input terminal of the amplifier 330. The connection between the current sensor 304 and the amplifier 340 can create a current feedback loop that can control the current flowing through the low-side switching element M2. By controlling the current flowing through the low-side switching element M2, an amount of power dissipated by low-side switching element M2 can be controlled. In an example, the amount of power dissipated by low-side switching element M2 can be limited by the current control loop formed between the current sensor 304 and the amplifier 340 in order to prevent excessive heating in the receiver 112. Further, the gate terminal of the high-side switching element Q2 can be connected to the source terminal of the high-side switching element Q2, via the node AC2, in order to turn off the high-side switching element Q2.

By using the circuits 130 and 140 to control the power dissipated by the low-side switching elements M1 and M2, the rectified voltage VRECT can be regulated in response to an occurrence of overvoltage condition. The circuits 130 and 140 can prevent excessive voltages on the voltage line 126, thus regulating VRECT to a constant and desirable level. For example, in response to an overvoltage event, the current loops formed shown in FIG. 3 can set the VGS of M1 and M2 to sink a predefined amount of current, such that the efficiency of the rectifier circuit 122 can be lowered to restrict (e.g., limit, stop, or slow down) VRECT from rising. The current loops can also control the current flowing in M1 and M2 to be proportional to VREF.

Figure 4:
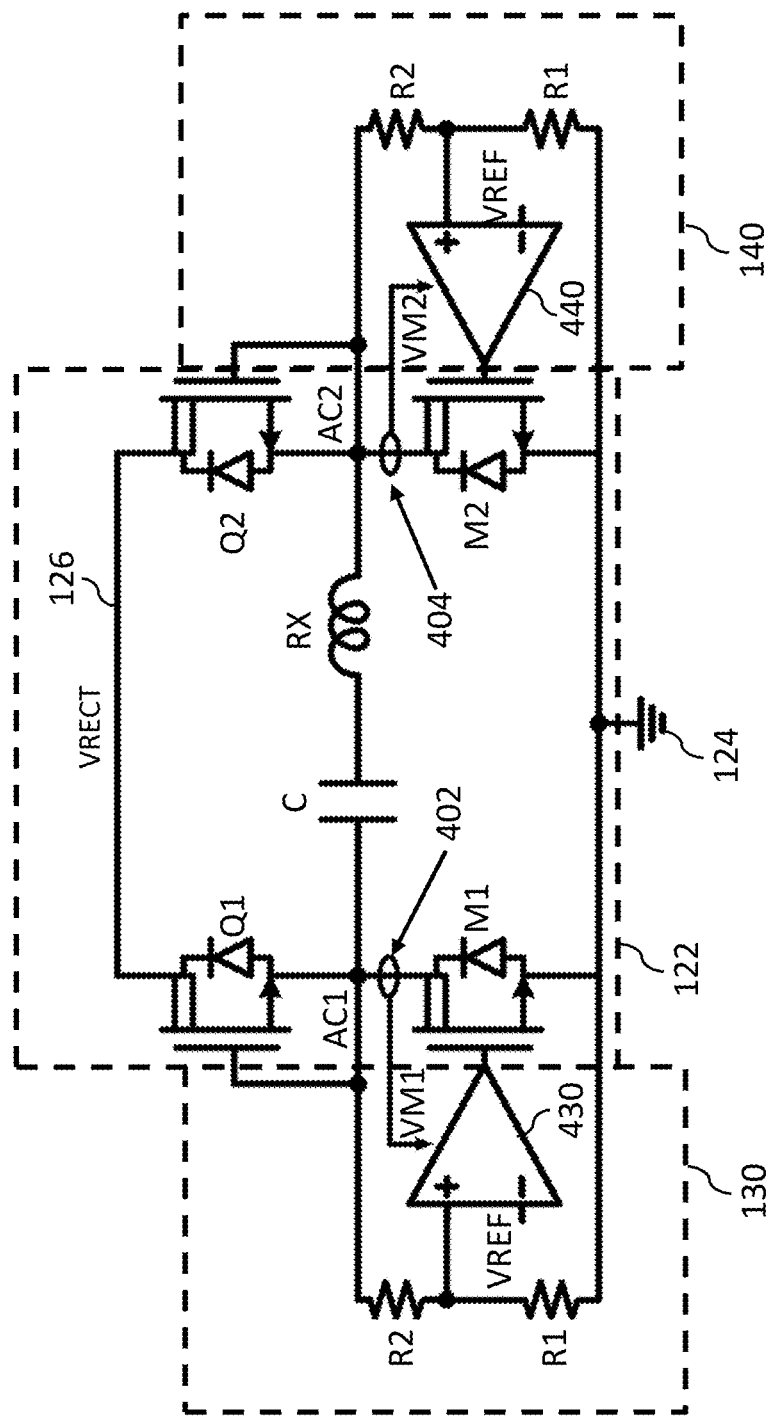
FIG. 4 is a diagram showing another example apparatus that can implement over voltage protection for wireless power receiver circuits in one embodiment.

FIG. 4 is a diagram showing an example apparatus 400 that can implement over voltage protection for wireless power receiver circuits in one embodiment. The apparatus 400 shown in FIG. 4 can be inside the receiver 112 shown in FIG. 1. The apparatus 400 can include the rectifier circuit 122, the circuit 130, the circuit 140, a current sensor 402, and a current sensor 404. The circuit 130 can include an amplifier 430, where an output terminal of the amplifier 430 can be connected to a gate terminal of the switching element M1. The circuit 140 can include an amplifier 440, where an output terminal of the amplifier 440 can be connected to a gate terminal of the switching element M2. The amplifiers 430 and 440 can be, for example, operational amplifiers (e.g., operational transconductance amplifiers (OTAs)) that can operate as a voltage controlled current source configured to receive differential input voltage and produce output current.

The current sensor 402 can be connected between the voltage node AC1 and a drain terminal of the low-side switching element M1. The current sensor 402 can be configured to sense the current flowing inside M1 and convert this sensed current into a voltage VM1. The current sensor 404 can be connected between the voltage node AC2 and a drain terminal of the low-side switching element M2. The current sensor 404 can be configured to sense the current flowing inside M2 and convert this sensed current into a voltage VM2. In an example embodiment, the current sensors 402 and 404 can each be implemented as a series resistor and an amplifier. It will be apparent to a person of ordinary skill in the art that other implementations of the current sensors 402 and 404 are probable, depending on a desired implementation of the system 100.

The inverting input terminal of the amplifier 430 can be connected to a reference voltage source configured to provide a reference voltage VREF. The non-inverting input terminal of the amplifier 430 can be connected to the node AC1 to detect a scaled down version of a voltage at the node AC1 (e.g., scaled by the factor of R1/(R1+R2)). The current sensor 402 can be connected to an auxiliary input terminal of the amplifier 430. A resistor having a resistance value of R2 can be connected between the non-inverting input terminal of the amplifier 430 and the node AC1. Another resistor having a resistor value of R1 can be connected between the non-inverting input terminal of the amplifier 430 and the ground terminal 124. Further, the gate terminal of the high-side switching element Q1 can be connected to a source terminal of the high-side switching element Q1, via the node AC1, in order to turn off the high-side switching element Q1.

The inverting input terminal of the amplifier 440 can be connected to the reference voltage source configured to provide the reference voltage VREF. The non-inverting input terminal of the amplifier 440 can be connected to the node AC2 to detect a scaled down version of a voltage at the node AC2 (e.g., scaled by the factor of R1/(R1+R2)). The current sensor 404 can be connected to an auxiliary input terminal of the amplifier 440. A resistor having the resistance value of R2 can be connected between the non-inverting input terminal of the amplifier 440 and the node AC2. Another resistor having the resistor value of R1 can be connected between the non-inverting input terminal of the amplifier 440 and the ground terminal 124. Further, the gate terminal of the high-side switching element Q2 can be connected to a source terminal of the high-side switching element Q2, via the node AC2, in order to turn off the high-side switching element Q2.

The connection between the node AC1 and the amplifier 430 can create a voltage feedback loop that can allow the amplifier 430 to operate based on the voltage on the node AC1. The connection between the node AC2 and the amplifier 440 can create a voltage feedback loop that can allow the amplifier 440 to operate based on the voltage on the node AC2. A comparison between the reference voltage VREF and a scaled down version of the voltage at the node AC1 (e.g., scaled by the factor of R1/(R1+R2)), and/or a comparison between the reference voltage VREF and a scaled down version of the voltage at the node AC2 (e.g., scaled by the factor of R1/(R1+R2)), can indicate whether an overvoltage condition is occurring in the receiver 112 or not.

The amplifier 430 can receive the reference voltage VREF and the voltage at the node AC1 as differential voltage input. An overvoltage event or condition can be detected in response to the voltage at the node AC1 being greater than the reference voltage VREF. In response to the overvoltage event, the amplifier 430 can output a voltage (e.g., a gate-source voltage VGS of M1) to activate the low-side switching element M1. The activation of the low-side switching element M1 can cause the current flowing into the node AC1 to split into two current paths—one current path going towards the voltage line 126 via the high-side switching element Q1, and the other current path going towards the ground terminal 124 via the activated low-side switching element M1.

The amplifier 440 can receive the reference voltage VREF and the voltage at the node AC2 as differential voltage input. An overvoltage event or condition can be detected in response to the voltage at the node AC2 being greater than the reference voltage VREF. In response to the overvoltage event, the amplifier 440 can output a voltage (e.g., a gate-source voltage VGS of M2) to activate the low-side switching element M2. The activation of the low-side switching element M2 can cause the current flowing into the node AC2 to split into two current paths—one current path going towards the voltage line 126 via the high-side switching element Q2, and the other current path going towards the ground terminal 124 via the activated low-side switching element M2.

In the example shown in FIG. 4, by activating the low-side switching elements M1 and/or M2 in response to a detection of overvoltage condition, the circuit 130 and 140 can provide overvoltage protection by redirecting a portion of current at the voltage nodes AC1 and AC2 toward the ground terminal 124. By redirecting the current at the voltage nodes AC1 and AC2 to the ground terminal 124, the voltages on the nodes AC1 and AC2, and the rectified voltage VRECT, can be controlled or adjusted. For example, the rectified voltage VRECT can be limited or clamped to a desired level to prevent overvoltage conditions. In an example, the redirecting of the current at the voltage nodes AC1 and AC2 to the ground terminal 124, and the values of the resistance R1, R2, and VREF, can define a maximum value of the rectified voltage VRECT, providing that the current in the low-side switching elements M1 and M2 are within the current limit (pr power dissipation limit) set by the current feedback loops. This defined maximum value of VRECT can allow the circuits 130 and 140 to clamp VRECT at a desired level in order to prevent overvoltage conditions. For example, the maximum value of VRECT can be defined as:

$$VRECT_{MAX} = VREF \cdot \left(1 + \frac{R2}{R1}\right) - V_{diode}$$

where $VRECT_{MAX}$ denotes the maximum value of VRECT and $V_{diode}$ defines the body diode of the high-side switching element where current is flowing through.

The connection between the current sensor 402 and the amplifier 430 can create a current feedback loop that can control the current flowing through the low-side switching element M1. By controlling the current flowing through the low-side switching element M1, an amount of power dissipated by low-side switching element M1 can be controlled. In an example, the amount of power dissipated by low-side switching element M1 can be limited by the current control loop formed between the current sensor 402 and the amplifier 430 in order to prevent excessive heating in the receiver 112.

The connection between the current sensor 404 and the amplifier 440 can create a current feedback loop that can control the current flowing through the low-side switching element M2. By controlling the current flowing through the low-side switching element M2, an amount of power dissipated by low-side switching element M2 can be controlled. In an example, the amount of power dissipated by low-side switching element M2 can be limited by the current control loop formed between the current sensor 404 and the amplifier 440 in order to prevent excessive heating in the receiver 112. Further, the gate terminal of the high-side switching element Q2 can be connected to the source terminal of the high-side switching element Q2, via the node AC2, in order to turn off the high-side switching element Q2.

By using the circuits 130 and 140 to control the power dissipated by the low-side switching elements M1 and M2, the rectified voltage VRECT can be regulated in response to an occurrence of overvoltage condition. The circuits 130 and 140 can prevent excessive voltages on the voltage line 126, thus regulating VRECT to a constant and desirable level. For example, in response to an overvoltage event, the current loops formed shown in FIG. 4 can set the VGS of M1 and M2 to sink a predefined amount of current, such that the efficiency of the rectifier circuit 122 can be lowered to restrict (e.g., limit, stop, or slow down) VRECT from rising. The current loops can also control the current flowing in M1 and M2 to be proportional to VREF.

The combination of the voltage feedback loop and the current feedback loop of the apparatus 400 can control the rectified voltage VRECT and also set the maximum power being dissipated by the low-side switching elements M1 and M2. The apparatus 400 can control or adjust the maximum value of VRECT until a current limit (or power dissipation limit) of the low-side switching elements M1 and M2 set by the current loop is met. Therefore, the embodiment shown in FIG. 4 can dissipate excessive power in order to avoid overvoltage events, but at the same time, a maximum power that the devices (e.g., M1 and M2) can be dissipated before burning occurs. For example, the regulation of the voltage VRECT can be switched to a regulation of the maximum current at M1 and M2, in order to prevent damages to the rectifier circuit 122. This switch allows differences between the power in excess and the power dissipated on M1 and M2 to be dissipated elsewhere.

Figure 5:
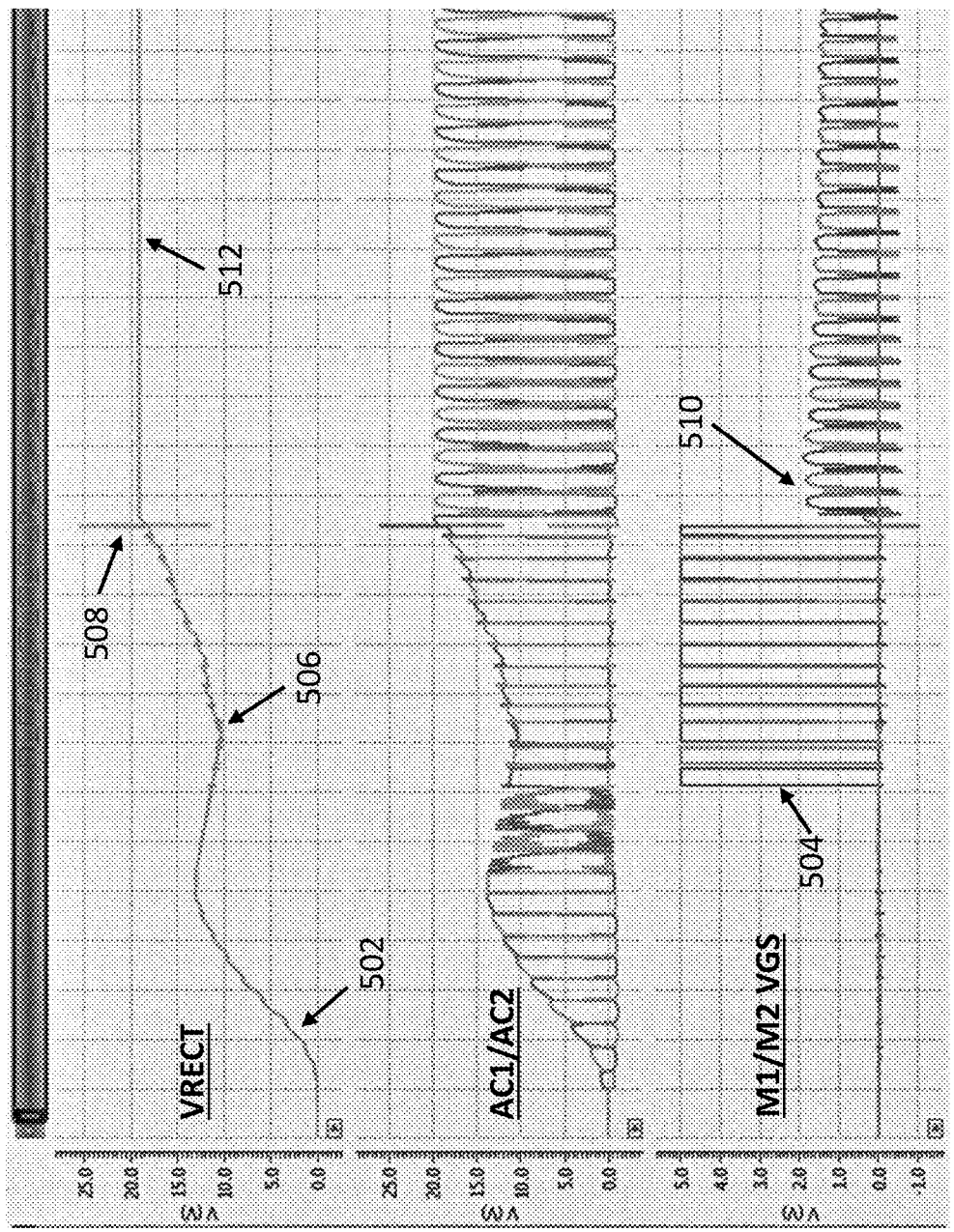
FIG. 5 is a diagram showing an example implementation result of over voltage protection for wireless power receiver circuits in one embodiment.

FIG. 5 is a diagram showing an example implementation result 500 of over voltage protection for wireless power receiver circuits in one embodiment. The result 500 shows the voltage levels of VRECT, AC1, AC2, VGS of M1, and VGS of M2. The result 500 is based on a process having an order of operations 502, 504, 506, 508, 510, and 512. At operation 502, the rectifier circuit 122 can go through a power up sequence in which the high-side switching elements Q1 and Q2, and the low-side switching elements M1 and M2, are switched off (but current can still flow via their body diodes). The Coil RX can receive the AC power 110, and causes the nodes AC1 and AC2 to receive power as well. The rectified voltage VRECT can also begin to increase. At operation 504, the rectifier circuit 122 can operate under normal condition, where the gate-source voltage VGS of the low-side switching elements M1 and M2 are switched alternatively between 0 volts (OFF state) to approximately 5V (ON state). The nodes AC1 and AC2 continues to receive AC power and the rectifier circuit 122 continues to output VRECT during operation 504.

At operation 506, VRECT may start to be unstable in response to, for example, an increase in the coupling coefficient of the transformer 128 (shown in FIG. 1) form by the RX and Coil TXs. For example, the coupling coefficient can increase from approximately 0.4 to 0.7 at operation 508, which can be a significant increase that can cause VRECT to increase past a reference voltage VREF, which can be set to 20 volts (V) shown in the result 500. Note that the value of VREF can be programmable depending on a desired implementation of the system 100 and/or the receiver 112. Thus, at operation 508, the receiver 112 can detect an overvoltage condition in response to VRECT reaching 20V. In response to the overvoltage condition, at operation 510, the circuits 130 and 140 can regulate VGS of the low-side switching elements M1 and M2 to a lower value in order to regulate VRECT to be no greater than a scaled version of VREF, which is 20V in the example shown in FIG. 5. At operation 512, the rectifier circuit 122 can continue to operate under a regulated condition such that VRECT may not be allowed to exceed the reference voltage VREF.

The system 100 described herein can provide overvoltage protection in wireless power receivers without adding additional interfaces, pins or external components on the receiver. Further, the addition of the operational amplifiers described herein can occupy relatively less silicon space than conventional internal voltage clamping switches and circuits. Furthermore, the system 100 utilizes existing rectifier circuit with the added operational amplifiers, thus avoiding a need to significantly redesign the wireless power receiver. Thus, the system 100 described herein can provide an inexpensive solution to respond to overvoltage conditions in wireless power receivers while occupying relatively less circuit board space when compared to other conventional approaches.

FIG. 6 is a flow diagram illustrating a process 600 of implementing over voltage protection for wireless power receiver circuits in one embodiment. The process can include one or more operations, actions, or functions as illustrated by one or more of blocks 602, 604, 606, and/or 608. Although illustrated as discrete blocks, various blocks can be divided into additional blocks, combined into fewer blocks, eliminated, or performed in parallel, depending on the desired implementation.

The process 600 can begin at block 602, where a receiver of an apparatus can receive alternating current (AC) power. In some examples, the receiver can be a wireless power receiver. The process 600 can proceed from block 602 to block 604. At block 604, a rectifier circuit of the apparatus can convert the AC power into a rectified voltage. The process 600 can proceed from block 604 to block 606. At block 606, a controller connected to the rectifier circuit can detect an occurrence of an overvoltage condition in the rectifier circuit. The process 600 can proceed from block 606 to block 608. At block 608, the controller can regulate a gate-source voltage of a low-side switching element of the rectifier circuit to control the rectified voltage in response to detecting the occurrence of the overvoltage condition in the rectifier circuit. In some examples, the controller can regulate the gate-source voltage of the low-side switching element by limiting the rectified voltage to a specific level.

In some examples, the controller can include an operational amplifier connected to the low-side switching element. An inverting input of the operational amplifier can be connected to a reference voltage. A non-inverting input of the operational amplifier can be connected to a node in the rectifier circuit. The node can be connected to a coil of the receiver, a drain terminal of the low-side switching element, and a source terminal of a high-side switching element of the rectifier circuit. The controller can further include a first resistor connected between the non-inverting input of the operational amplifier and the node. The controller can further include a second resistor connected to the non-inverting input of the operational amplifier, a source terminal of the low-side switching element, and a ground terminal. A maximum value of the rectified voltage can be set based on the reference voltage and a ratio of a resistance of the first resistor to a resistance of the second resistor.

In some examples, the controller can include an operational amplifier connected to the low-side switching element. An inverting input of the operational amplifier can be connected to a reference voltage. An auxiliary input of the operational amplifier can be connected to an output of a current sensor that can sense the current flowing through the low-side switching element. A power dissipation of the low-side switching element can be controlled based on the current being sensed at the drain terminal of the low-side switching element.

In some examples, the controller can include an operational amplifier connected to the low-side switching element. An inverting input of the operational amplifier can be connected to a reference voltage. A non-inverting input of the operational amplifier can be connected to a node in the rectifier circuit. The node can be connected to a coil of the receiver, a drain terminal of the low-side switching element, and a source terminal of a high-side switching element of the rectifier circuit. An auxiliary input of the operational amplifier can be connected to an output of a current sensor that can sense current flowing through drain terminal of the low-side switching element. The controller can further include a first resistor connected between the non-inverting input of the operational amplifier and the node. The controller can further include a second resistor connected to the non-inverting input of the operational amplifier, a source terminal of the low-side switching element, and a ground terminal. A power dissipation of the low-side switching element can be controlled based on the current being sensed by the current sensor. A maximum value of the rectified voltage can be set based on the reference voltage and a ratio of a resistance of the first resistor to a resistance of the second resistor.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements, if any, in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. An apparatus comprising:
a rectifier circuit configured to output a rectified voltage; and
a controller connected to the rectifier circuit, the controller being configured to regulate a gate-source voltage of a low-side switching element of the rectifier circuit to control the rectified voltage,
wherein the controller comprises an operational amplifier connected to the low-side switching element,
wherein the rectifier circuit is connected to a coil of a receiver,
wherein an inverting input of the operational amplifier is connected to a reference voltage,
wherein a non-inverting input of the operational amplifier is connected to a node in the rectifier circuit, the node is connected to the coil, a drain terminal of the low-side switching element, and a source terminal of a high-side switching element of the rectifier circuit, and
wherein the controller further comprises:
a first resistor connected between the non-inverting input of the operational amplifier and the node; and
a second resistor connected to the non-inverting input of the operational amplifier, a source terminal of the low-side switching element, and a ground terminal,
wherein a maximum value of the rectified voltage is set based on the reference voltage and a ratio of a resistance of the first resistor to a resistance of the second resistor.

2. The apparatus of claim 1,
wherein the controller is configured to:
detect an occurrence of an overvoltage condition in the rectifier circuit; and
regulate the gate-source voltage of the low-side switching element in response to detecting the occurrence of the overvoltage condition in the rectifier circuit.

3. The apparatus of claim 1 wherein the receiver is a wireless power receiver.

4. The apparatus of claim 1, wherein the controller is configured to regulate the gate-source voltage of the low-side switching element by limiting the rectified voltage to a specific level.

5. The apparatus of claim 1,
wherein an auxiliary input of the operational amplifier is connected to an output of a current sensor that senses current flowing through the low-side switching element, and
wherein a power dissipation of the low-side switching element is controlled based on the current being sensed by the current sensor.

6. An apparatus comprising:
a receiver configured to receive alternating current (AC) power;
a rectifier circuit configured to convert the AC power into a rectified voltage;
a controller connected to the rectifier circuit, the controller being configured to regulate a gate-source voltage of a low-side switching element of the rectifier circuit to control the rectified voltage,
wherein the controller comprises an operational amplifier connected to the low-side switching element,
wherein an inverting input of the operational amplifier is connected to a reference voltage,
wherein a non-inverting input of the operational amplifier is connected to a node in the rectifier circuit, the node is connected to a coil of the receiver, a drain terminal of the low-side switching element, and a source terminal of a high-side switching element of the rectifier circuit, and
wherein the controller further comprises:
a first resistor connected between the non-inverting input of the operational amplifier and the node; and
a second resistor connected to the non-inverting input of the operational amplifier, a source terminal of the low-side switching element, and a ground terminal,
wherein a maximum value of the rectified voltage is set based on the reference voltage and a ratio of a resistance of the first resistor to a resistance of the second resistor.

7. The apparatus of claim 6, wherein the controller is configured to:
detect an occurrence of an overvoltage condition in the rectifier circuit; and
regulate the gate-source voltage of the low-side switching element in response to detecting the occurrence of the overvoltage condition in the rectifier circuit.

8. The apparatus of claim 6, wherein the receiver is a wireless power receiver.

9. The apparatus of claim 6, wherein the controller is configured to regulate the gate-source voltage of the low-side switching element by limiting the rectified voltage to a specific level.

10. The apparatus of claim 6,
wherein an auxiliary input of the operational amplifier is connected to an output of a current sensor that senses current flowing through the low-side switching element, element; and
wherein a power dissipation of the low-side switching element is controlled based on the current being sensed by the current sensor.

11. A method comprising:
regulating a gate-source voltage of a low-side switching element of a rectifier circuit to control a rectified voltage being outputted by the rectifier circuit, wherein regulating the gate-source voltage of the low-side switching element of the rectifier circuit comprises:
regulating the gate-source voltage of the low-side switching element using an operational amplifier, wherein a maximum value of the rectified voltage is set based on a reference voltage and a ratio of a resistance of a first resistor to a resistance of a second resistor,
wherein the first resistor is connected between a non-inverting input of the operational amplifier and a node, the node is connected to a coil of a receiver, a drain terminal of the low-side switching element, and a source terminal of a high-side switching element of the rectifier circuit, and
wherein the second resistor is connected to the non-inverting input of the operational amplifier, a source terminal of the low-side switching element, and a ground terminal.

12. The method of claim 11, further comprising:
detecting an occurrence of an overvoltage condition in the rectifier circuit; and
in response to detecting the occurrence of the overvoltage condition in the rectifier circuit, regulating the gate-source voltage of the low-side switching element by limiting the rectified voltage to a specific level.

13. The method of claim 11, further comprising:
controlling a power dissipation of the low-side switching element based on an amount of current flowing through the low-side switching element.

* * * * *